United States Patent
Kozyuk (10) Patent No.: US 7,041,144 B2
(45) Date of Patent: May 9, 2006

(54) HYDRODYNAMIC CAVITATION CRYSTALLIZATION PROCESS

(75) Inventor: Oleg V. Kozyuk, Westlake, OH (US)

(73) Assignee: Five Star Technologies, Inc., Cleveland, OH (US)

( * ) Notice: Subject to any disclaimer, the term of this patent is extended or adjusted under 35 U.S.C. 154(b) by 208 days.

(21) Appl. No.: 10/382,117

(22) Filed: Mar. 4, 2003

(65) Prior Publication Data

US 2004/0173139 A1 Sep. 9, 2004

(51) Int. Cl.
   *B01D 9/00* (2006.01)

(52) U.S. Cl. .................................... 23/295 R

(58) Field of Classification Search ............... 23/295 R, 23/299, 300, 303, 302 T
   See application file for complete search history.

(56) References Cited

U.S. PATENT DOCUMENTS

| | | | |
|---|---|---|---|
| 4,997,454 A | 3/1991 | Violante et al. | |
| 5,314,506 A | 5/1994 | Midler, Jr. et al. | |
| 5,578,279 A | 11/1996 | Dauer et al. | |
| 5,833,891 A | * 11/1998 | Subramaniam et al. | 264/7 |
| 6,063,138 A | * 5/2000 | Hanna et al. | 23/295 R |
| 6,221,398 B1 | 4/2001 | Jakupovic et al. | |
| 6,302,958 B1 | 10/2001 | Lindrud et al. | |

OTHER PUBLICATIONS

FAQ Sonocrystallization; http://www.aeat.co.uk/sono/son-faq.htm; Mar. 20, 2002.

\* cited by examiner

*Primary Examiner*—Edward M. Johnson
(74) *Attorney, Agent, or Firm*—Benesch, Friedlander, Coplan & Aronoff, LLP (57) ABSTRACT

A device and process for crystallizing a compound using hydrodynamic cavitation comprising the steps of mixing at least one stream of a solution of such compound to be crystallized with at least one stream of an anti-solvent and passing the mixed streams at an elevated pressure through a local constriction of flow to create hydrodynamic cavitation thereby causing nucleation and the direct production of crystals.

20 Claims, 4 Drawing Sheets

HYDRODYNAMIC CAVITATION CRYSTALLIZATION PROCESS

BACKGROUND OF THE INVENTION

The present invention relates to a device and process for crystallizing compounds using hydrodynamic cavitation. The types of compounds that may be crystallized include pharmaceutical compounds as well as any other compounds used in industry.

Crystallization from solution of pharmaceutically active compounds or their intermediates is the typical method of purification used in industry. The integrity of the crystal structure, or crystal habit, that is produced and the particle size of the end product are important considerations in the crystallization process.

High bioavailability and short dissolution time are desirable or often necessary attributes of the pharmaceutical end product. However, the direct crystallization of small sized, high surface area particles is usually accomplished in a high supersaturation environment which often results in material of low purity, high friability, and decreased stability due to poor crystal structure formation. Because the bonding forces in organic crystal lattices generate a much higher frequency of amorphism than those found in highly ionic inorganic solids, "oiling out" of supersaturated material is not uncommon, and such oils often solidify without structure.

Slow crystallization is a common technique used to increase product purity and produce a more stable crystal structure, but it is a process that decreases crystallizer productivity and produces large, low surface area particles that require subsequent high intensity milling. Currently, pharmaceutical compounds almost always require a post-crystallization milling step to increase particle surface area and thereby improve their bioavailability. However, high energy milling has drawbacks. Milling may result in yield loss, noise and dusting, as well as unwanted personnel exposure to highly potent pharmaceutical compounds. Also, stresses generated on crystal surfaces during milling can adversely affect labile compounds. Overall, the three most desirable end-product goals of high surface area, high chemical purity, and high stability cannot be optimized simultaneously using current crystallization technology without high energy milling.

One standard crystallization procedure involves contacting a supersaturated solution of the compound to be crystallized with an appropriate "anti-solvent" in a stirred vessel. Within the stirred vessel, the anti-solvent initiates primary nucleation which leads to crystal formation, sometimes with the help of seeding, and crystal digestion during an aging step. Mixing within the vessel can be achieved with a variety of agitators (e.g., Rushton or Pitched blade turbines, Intermig, etc.), and the process is done in a batchwise fashion.

When using current reverse addition technology for direct small particle crystallization, a concentration gradient can not be avoided during initial crystal formation because the introduction of feed solution to anti-solvent in the stirred vessel does not afford a thorough mixing of the two fluids prior to crystal formation. The existence of concentration gradients, and therefore a heterogeneous fluid environment at the point of initial crystal formation, impedes optimum crystal structure formation and increases impurity entrainment. If a slow crystallization technique is employed, more thorough mixing of the fluids can be attained prior to crystal formation which will improve crystal structure and purity, but the crystals produced will be large and milling will be necessary to meet bioavailability requirements.

Another standard crystallization procedure employs temperature variation of a solution of the material to be crystallized in order to bring the solution to its supersaturation point, but this is a slow process that produces large crystals. Also, despite the elimination of a solvent gradient with this procedure, the resulting crystal characteristics of size, purity and stability are difficult to control and are inconsistent from batch to batch.

Another crystallization procedure utilizes impinging jets to achieve high intensity micromixing in the crystallization process. High intensity micromixing is a well known technique where mixing-dependent reactions are involved. In U.S. Pat. No. 5,314,456 there is described a method using two impinging jets to achieve uniform particles. The general process involves two impinging liquid jets positioned within a well stirred flask to achieve high intensity micromixing. At the point where the two jets strike one another a very high level of supersaturation exists. As a result of this high supersaturation, crystallization occurs extremely rapidly within the small mixing volume at the impingement point of the two liquids. Since new crystals are constantly nuceleating at the impingement point, a very large number of crystals are produced. As a result of the large number of crystals formed, the average size remains small, although not all the crystals formed are small in size.

On the other hand, crystallization procedures using hydrodynamic cavitation have not yet been proposed. Cavitation is the formation of bubbles and cavities within a liquid stream resulting from a localized pressure drop in the liquid flow. If the pressure at some point decreases to a magnitude under which the liquid reaches the boiling point for this fluid, then a great number of vapor-filled cavities and bubbles are formed. As the pressure of the liquid then increases, vapor condensation takes place in the cavities and bubbles, and they collapse, creating very large pressure impulses and very high temperatures. According to some estimations, the temperature within the bubbles attains a magnitude on the order of 5000° C. and a pressure of approximately 500 kg/cm$^2$ (K. S. Suslick, Science, Vol. 247, 23 Mar. 1990, pgs. 1439–1445). Cavitation involves the entire sequence of events beginning with bubble formation through the collapse of the bubble. Because of this high energy level, it would be desirable to provide a device and process for crystallizing compounds using hydrodynamic cavitation. Devices and methods to create and control hydrodynamic cavitation are known in the art for use in mixing, conducting sonochemical type reactions, and preparing metal containing compounds, see e.g., U.S. Pat. Nos. 5,810,052, 5,931,771, 5,937,906, 6,012,492, and 6,365,555 to Kozyuk which are hereby incorporated by reference in their entireties.

BRIEF DESCRIPTION OF THE DRAWINGS

These and other features, aspects, and advantages of the present invention will become better understood with regard to the following description, appended claims, and accompanying drawings where:

DETAILED DESCRIPTION OF THE INVENTION

In the description that follows, like parts are indicated throughout the specification and drawings with the same reference numerals, respectively. The figures are not drawn to scale and the proportions of certain parts have been exaggerated for convenience of illustration.

The present invention provides a device and process for using hydrodynamic cavitation to effect nucleation in a crystallization process. The two fluids used in this process can be of different solvent composition, one fluid being a solution of the compound to be crystallized in a suitable solvent or combination of solvents ("feed solution"), and the other fluid being a suitable solvent or combination of solvents capable of initiating that compound's precipitation from solution ("anti-solvent"), chosen for its relatively low solvation property with respect to that compound. Such solvents and anti-solvents can include, but are not limited to, ethanol, methanol, ethyl acetate, halogenated solvents such as methylene chloride, acetonitrile, acetic acid, hexanes, ethers, and water.

The fluids used in this process can also contain a small amount of a suitable surfactant which may alleviate agglomeration that might occur during the hydrodynamic cavitation crystallization process. The surfactant can be added as part of a premix, or it can be added through one of the entry ports discussed herein. Thus, one, several, or all of the fluids employed may contain a surfactant. Since such a surfactant may be incorporated in the crystalline compound, a surfactant should be chosen which will be innocuous to the eventual use of the crystalline compound.

Figure 1:
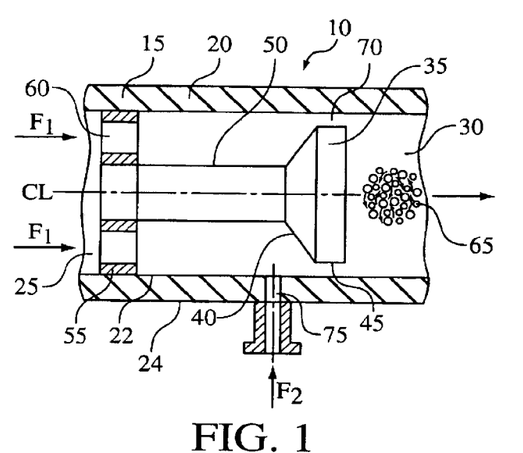
FIG. 1 is a longitudinal section of hydrodynamic cavitation crystallization device 10 according to one embodiment of the present invention.

Referring now to the drawings, FIG. 1 illustrates a hydrodynamic cavitation crystallization device 10 comprising a flow-through channel 15 defined by a cylindrical wall 20 having an inner surface 22, an outer surface 24, an inlet 25 for introducing a first fluid stream $F_1$ (in the direction of the arrows) into device 10 and an outlet 30 for exiting fluid from device 10. Although it is preferred that the cross-section of flow-through channel 15 is circular, the cross-section of flow-through channel 15 may take the form of any geometric shape such as square, rectangular, or hexagonal and still be within the scope of the present invention.

Disposed within flow-through channel 15 along or near the centerline $C_L$ of flow-through channel 15 is a cavitation generator such as a baffle 35. As shown in FIG. 1, baffle 35 includes a conically-shaped surface 40 extending into a cylindrically-shaped surface 45 wherein conically-shaped portion 40 of baffle 35 confronts the fluid flow. Baffle 35 is positioned on a stem 50 that is connected to a disk 55 having orifices 60. Disk 55 is mounted in inlet 25 and retains baffle 35 inside flow-through channel 15. In place of disk 55 having orifices 60, it is possible to use a crosshead, post, propeller or any other fixture that produces a minor loss of pressure.

Baffle 35 is configured to generate a hydrodynamic cavitation field 65 downstream from baffle 35 via a local constriction 70 of fluid flow. In this embodiment, local constriction 70 is an annular orifice defined between inner surface 22 of flow-through channel 15 and cylindrically-shaped surface 45 of baffle 35. Although local constriction 70 is an annular orifice because of the cylindrically-shaped surface 45 of baffle 35 and the circular cross-section of cylindrical wall 20, one skilled in the art would understand that if the cross-section of flow-through channel 15 is any other geometric shape other than circular, then the local constriction 70 defined between the wall forming flow-through channel 15 and baffle 35 may not be annular in shape. Likewise, if baffle 35 is not circular in cross-section, then the local constriction 70 defined between the wall forming flow-through channel 15 and baffle 35 may not be annular in shape. Preferably, the cross-sectional geometric shape of the wall forming flow-through channel 15 matches the cross-sectional geometric shape of baffle 35 (e.g., circular-circular, square-square, etc.).

To further promote the creation and control of cavitation fields downstream from baffle 35, baffle 35 is constructed to be removable and replaceable by any baffle having a variety of shapes and configurations to generate varied hydrodynamic cavitation fields. The shape and configuration of baffle 35 can significantly affect the character of the cavitation flow and, correspondingly, the quality of crystallization. Although there are an infinite variety of shapes and configurations that can be utilized within the scope of this invention, U.S. Pat. No. 5,969,207, issued on Oct. 19, 1999, discloses several acceptable baffle shapes and configurations, and U.S. Pat. No. 5,969,207 is hereby incorporated by reference in its entirety herein.

It is understood that baffle 35 can be removably mounted to stem 50 in any acceptable fashion. However, it is preferred that baffle 35 threadedly engages stem 50. Therefore, in order to change the shape and configuration of baffle 35, stem 50 is removed from device 10 and the original baffle 35 is unscrewed from stem 50 and replaced by a different baffle element that is threadedly engaged to stem 50 and replaced within device 10.

Figure 2:
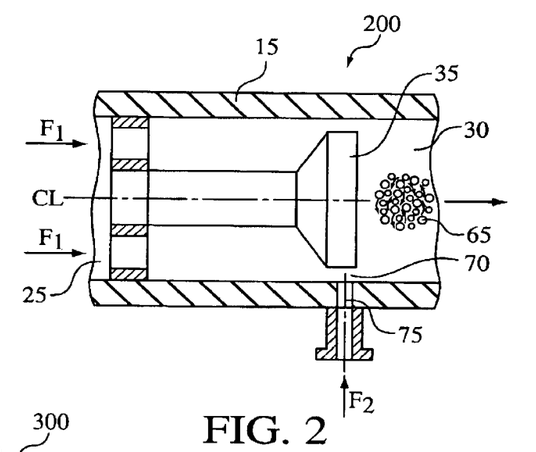
FIG. 2 is a longitudinal section of hydrodynamic cavitation crystallization device 200 according to another embodiment of the present invention.
Figure 3:
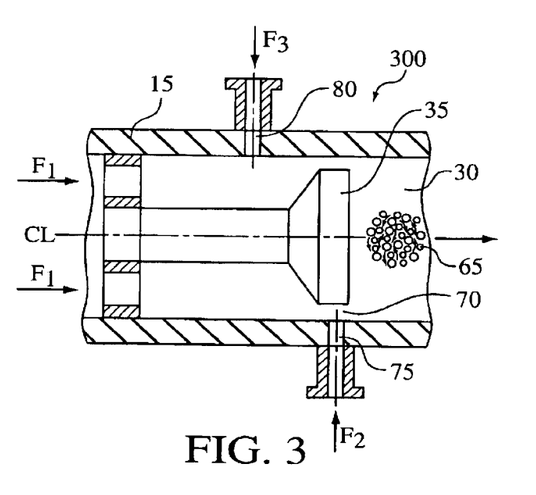
FIG. 3 is a longitudinal section of hydrodynamic cavitation crystallization device 300 according to another embodiment of the present invention.

Disposed in cylindrical wall 20 of flow-through channel 15 is a port 75 for introducing a second fluid stream $F_2$ (in the direction indicated by the arrow) into flow-through channel 15. Port 75 is positioned in cylindrical wall 20 of flow-through channel 15 upstream from baffle 35. In a slightly different embodiment as shown in FIG. 2, device 200 includes a port 75 that is disposed in cylindrical wall 20 of flow-through channel 15 adjacent local constriction 70 such that second fluid stream $F_2$ mixes with the first fluid stream $F_1$ in local constriction 70. In yet another embodiment as shown in FIG. 3, device 300 includes a second port 80 disposed in cylindrical wall 20 of flow-through channel 15 to permit introduction of a third fluid stream $F_3$ (in the direction indicated by the arrow) into flow-through channel 15. Second port 80 is positioned upstream from baffle 35.

In operation of device 10 illustrated in FIG. 1, first fluid stream $F_1$ enters flow-through channel 15 via inlet 25 and moves through orifices 60 in disk 55 in the direction by the arrows beneath $F_1$. Second fluid stream $F_2$ enters flow-through channel 15 via port 75 and mixes with the first fluid stream $F_1$ prior to confronting baffle 35. In one embodiment, first fluid stream $F_1$ is an anti-solvent and second fluid stream $F_2$ is a feed solution. Alternatively, in another embodiment, first fluid stream $F_1$ is a feed solution and second fluid stream $F_2$ is an anti-solvent.

The mixed first and second fluid streams $F_1$, $F_2$ then pass through local constriction 70 of flow, where the velocity of first and second fluid streams $F_1$, $F_2$ increases to a minimum velocity (i.e., velocity at which cavitation bubbles begin to appear) dictated by the physical properties of the first and second fluid streams $F_1$, $F_2$. As the first and second fluid streams $F_1$, $F_2$ pass through local constriction 70 of flow, hydrodynamic cavitation field 65 (which generates cavitation bubbles) is formed downstream of baffle 35. Upon reaching an elevated static pressure zone, the bubbles collapse causing high local pressures (to 5,000 kg/cm$^2$) and temperatures (to 15,000° C.) to effect nucleation and thereby directly produce tiny crystals. The remaining fluids exit flow-through channel 15 via outlet 30, while the product crystals are isolated using conventional recovery techniques.

In operation of device 200 illustrated in FIG. 2, first fluid stream $F_1$ enters flow-through channel 15 via inlet 25 and moves through orifices 60 in disk 55 in the direction by the arrows beneath $F_1$. Second fluid stream $F_2$ enters flow-through channel 15 via port 75 and mixes with the first fluid stream $F_1$ while first fluid stream $F_1$ is passing through local constriction 70. In one embodiment, first fluid stream $F_1$ is an anti-solvent and second fluid stream $F_2$ is a feed solution. Alternatively, in another embodiment, first fluid stream $F_1$ is a feed solution and second fluid stream $F_2$ is an anti-solvent.

While passing through local constriction 70 of flow, the velocity of mixed first and second fluid streams $F_1$, $F_2$ increases to a minimum velocity (i.e., velocity at which cavitation bubbles begin to appear) dictated by the physical properties of the first and second fluid streams $F_1$, $F_2$. As the first and second fluid streams $F_1$, $F_2$ pass through local constriction 70 of flow, hydrodynamic cavitation field 65 (which generates cavitation bubbles) is formed downstream of baffle 35. Upon reaching an elevated static pressure zone, the bubbles collapse causing high local pressures (to 5,000 kg/cm$^2$) and temperatures (to 15,000° C.) to effect nucleation and thereby directly produce tiny crystals. The remaining fluids exit flow-through channel 15 via outlet 30, while the product crystals are isolated using conventional recovery techniques.

In operation of device 300 illustrated in FIG. 3, first fluid stream $F_1$ enters flow-through channel 15 via inlet 25 and moves through orifices 60 in disk 55 in the direction indicated by the arrows beneath $F_1$. Second fluid stream $F_2$ enters flow-through channel 15 via second port 80 and mixes with the first fluid stream $F_1$ prior to confronting baffle 35. Third fluid stream $F_3$ enters flow-through channel 15 via port 75 and mixes with first and second fluid streams $F_1$, $F_2$ while they are passing through local constriction 70. In one embodiment, first fluid stream $F_1$ is an anti-solvent and second and third fluid streams $F_2$, $F_3$ are the same or different feed solutions having the same or different concentrations. Alternatively, in another embodiment, first fluid stream $F_1$ is a feed solution, and second and third fluid streams $F_2$, $F_3$ are the same or different anti-solvents having the same or different concentrations.

While passing through local constriction 70 of flow, the velocity of mixed first, second, and third fluid streams $F_1$, $F_2$, $F_3$ increases to a minimum velocity (i.e., velocity at which cavitation bubbles begin to appear) dictated by the physical properties of the first, second, and third fluid streams $F_1$, $F_2$, $F_3$. As the first, second, and third fluid streams $F_1$, $F_2$, $F_3$ continue to pass through local constriction 70 of flow, hydrodynamic cavitation field 65 (which generates cavitation bubbles) is formed downstream of baffle 35. Upon reaching an elevated static pressure zone, the bubbles collapse causing high local pressures (to 5,000 kg/cm$^2$) and temperatures (to 15,000° C.) to effect nucleation and thereby directly produce tiny crystals. The remaining fluids exit flow-through channel 15 via outlet 30, while the product crystals are isolated using conventional recovery techniques.

Figures 4, 5, 6:
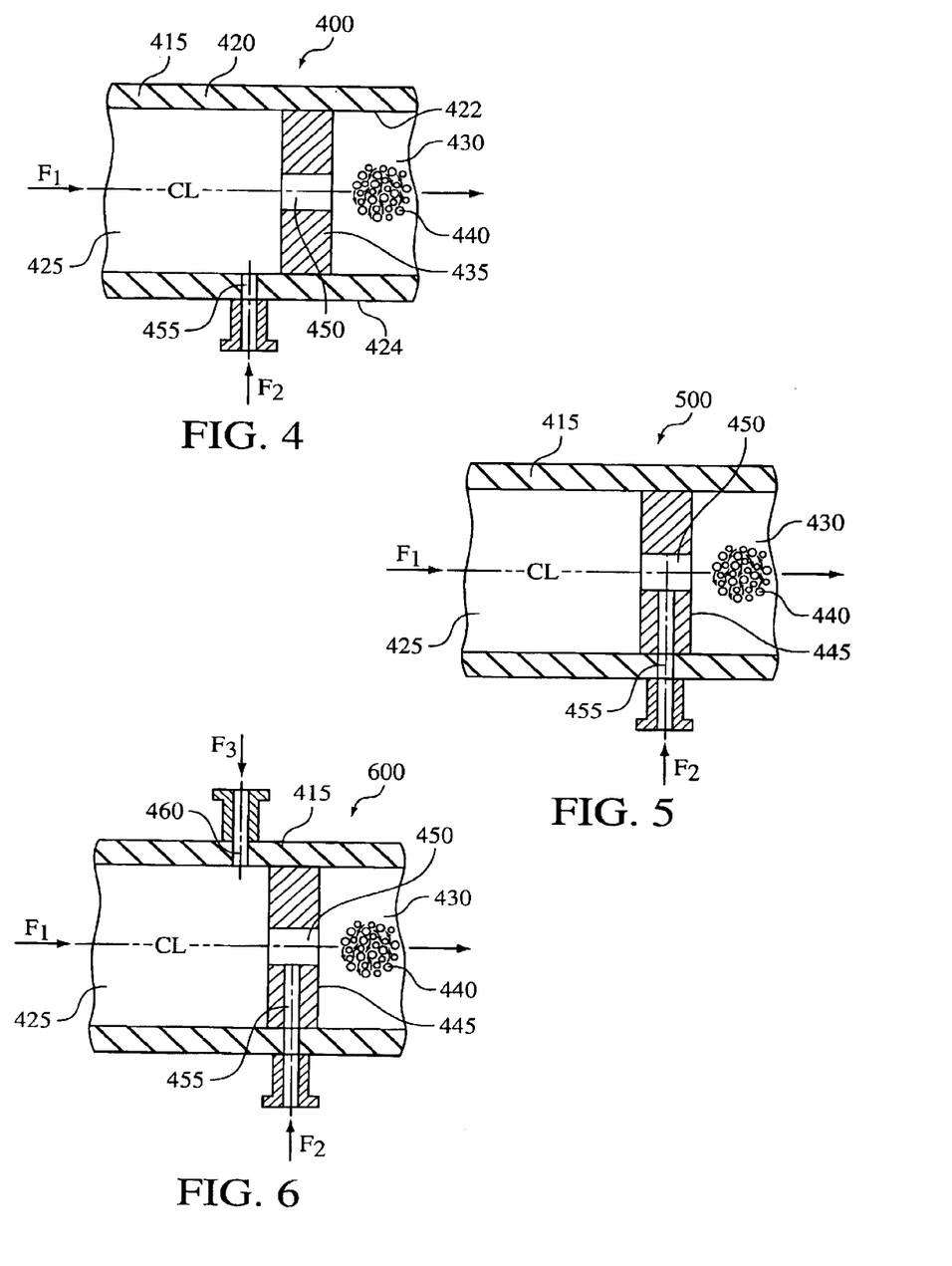
FIG. 4 is a longitudinal section of hydrodynamic cavitation crystallization device 400 according to another embodiment of the present invention.
FIG. 5 is a longitudinal section of hydrodynamic cavitation crystallization device 500 according to another embodiment of the present invention.
FIG. 6 is a longitudinal section of hydrodynamic cavitation crystallization device 600 according to another embodiment of the present invention.

Referring now to FIG. 4, a hydrodynamic cavitation crystallization device 400 comprises a flow-through channel 415 defined by a cylindrical wall 420 having an inner surface 422, an outer surface 424, an inlet 425 for introducing a first fluid stream $F_1$ (in the direction of the arrows) into device 400, and an outlet 430 for exiting fluid from device 400. Although it is preferred that the cross-section of flow-through channel 415 is circular, the cross-section of flow-through channel 415 may take the form of any geometric shape such as square, rectangular, or hexagonal and still be within the scope of the present invention.

Figure 7:
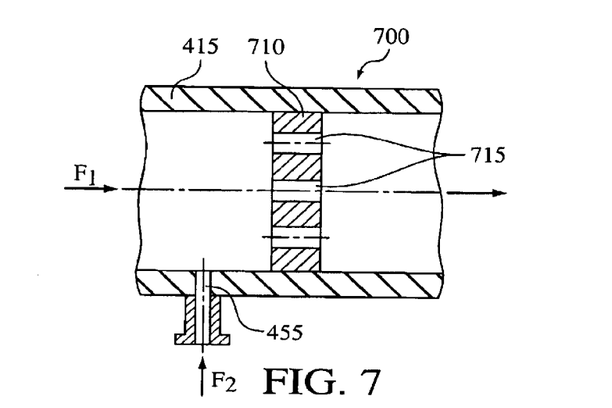
FIG. 7 is a longitudinal section of hydrodynamic cavitation crystallization device 700 according to another embodiment of the present invention.

Disposed within flow-through channel 415 is a cavitation generator 435 configured to generate a hydrodynamic cavitation field 440 downstream from cavitation generator 435. As shown in FIG. 4, cavitation generator 435 is a disk 445 having a circular orifice 450 disposed therein situated along or near the centerline $C_L$ of flow-through channel 415. Orifice 450 is in the shape of Venturi tube and produces a local constriction of fluid flow. In a slightly different embodiment as shown in FIG. 7, device 700 includes a disk 710 having multiple circular orifices 715 disposed therein to produce multiple local constrictions of fluid flow. Although it is preferred that the cross-section of the orifices in the disc are circular, the cross-section of the orifice may take the form of any geometric shape such as square, rectangular, or hexagonal and still be within the scope of the present invention.

To further promote the creation and control of cavitation fields downstream from disk 445 having orifice 450, disk 445 having orifice 450 is constructed to be removable and replaceable by any disk having an orifice shaped and configured in a variety of ways to generate varied hydrodynamic cavitation fields. The shape and configuration of orifice 450 can significantly affect the character of the cavitation flow and, correspondingly, the quality of crystallization. Although there are an infinite variety of shapes and configurations that can be utilized within the scope of this invention, U.S. Pat. No. 5,969,207, issued on Oct. 19, 1999, discloses several acceptable baffle shapes and configurations, and U.S. Pat. No. 5,969,207 is hereby incorporated by reference in its entirety herein.

Disposed in cylindrical wall 420 of flow-through channel 415 is an entry port 455 for introducing a second fluid stream $F_2$ (in the direction of the arrows) into flow-through channel 415. Port 455 is disposed in cylindrical wall 420 of flow-through channel 415 upstream from disk 445. In a slightly different embodiment as shown in FIG. 5, device 500 includes a port 455 disposed in cylindrical wall 420 of flow-through channel 415 and extending through disk 445 such that port 455 is in fluid communication with orifice 450. Thus, second fluid stream $F_2$ mixes with first fluid stream $F_1$ in orifice 450. In yet another embodiment as shown in FIG. 6, device 600 includes a second port 460 disposed in cylindrical wall 420 of flow-through channel 415 to permit introduction of a third fluid stream $F_3$ into flow-through channel 415. Second port 460 is positioned upstream from disk 445.

In operation of device 400 illustrated in FIG. 4, first fluid stream $F_1$ enters flow-through channel 415 via inlet 425 and moves through flow-through channel 415 along the direction indicated by the arrow beneath $F_1$. Second fluid stream $F_2$ enters flow-through channel 415 via entry port 455 and mixes with first fluid stream $F_1$ prior to passing through orifice 450. In one embodiment, first fluid stream $F_1$ is an anti-solvent and second fluid stream $F_2$ is a feed solution. Alternatively, in another embodiment, first fluid stream $F_1$ is a feed solution and second fluid stream $F_2$ is an anti-solvent.

The mixed first and second fluid streams $F_1$, $F_2$ then pass through orifice 450, where the velocity of first and second fluid streams $F_1$, $F_2$ increases to a minimum velocity (i.e., velocity at which cavitation bubbles begin to appear) dictated by the physical properties of the first and second fluid streams $F_1$, $F_2$. As the first and second fluid streams $F_1$, $F_2$ pass through orifice 450, hydrodynamic cavitation field 440 (which generates cavitation bubbles) is formed downstream of orifice 450. Upon reaching an elevated static pressure zone, the bubbles collapse causing high local pressures (to 5,000 kg/cm$^2$) and temperatures (to 15,000° C.) to effect nucleation and thereby directly produce tiny crystals. The remaining fluids exit flow-through channel 415 via outlet 430, while the product crystals are isolated using conventional recovery techniques.

In operation of device 500 illustrated in FIG. 5, first fluid stream $F_1$ enters flow-through channel 415 via inlet 425 and moves through flow-through channel 415 along the direction indicated by the arrow beneath $F_1$. Second fluid stream $F_2$ enters flow-through channel 415 via entry port 455 and mixes with first fluid stream $F_1$ while first fluid stream $F_1$ is passing through orifice 450. In one embodiment, first fluid stream $F_1$ is an anti-solvent and second fluid stream $F_2$ is a feed solution. Alternatively, in another embodiment, first fluid stream $F_1$ is a feed solution and second fluid stream $F_2$ is an anti-solvent.

While passing through orifice 450, the velocity of mixed first and second fluid streams $F_1$, $F_2$ increases to a minimum velocity (i.e., velocity at which cavitation bubbles begin to appear) dictated by the physical properties of first and second fluid streams $F_1$, $F_2$. As the first and second fluid streams $F_1$, $F_2$ pass through orifice 450, hydrodynamic cavitation field 440 (which generates cavitation bubbles) is formed downstream of orifice 450. Upon reaching an elevated static pressure zone, the bubbles collapse causing high local pressures (to 5,000 kg/cm$^2$) and temperatures (to 15,000° C.) to effect nucleation and thereby directly produce tiny crystals. The remaining fluids exit flow-through channel 415 via outlet 430, while the product crystals are isolated using conventional recovery techniques.

In operation of device 600 illustrated in FIG. 6, first fluid stream $F_1$ enters flow-through channel 415 via inlet 425 and moves through flow-through channel 415 along the direction indicated by the arrow beneath $F_1$. Second fluid stream $F_2$ enters flow-through channel 415 via second port 460 and mixes with first fluid stream $F_1$ prior to passing through orifice 450. Third fluid stream $F_3$ enters flow-through channel 415 via entry port 455 and mixes with the first and second fluid streams $F_1$, $F_2$ while they are passing through orifice 450. In one embodiment, first fluid stream $F_1$ is an anti-solvent and second and third fluid streams $F_2$, $F_3$ are the same or different feed solutions having the same or different concentrations. Alternatively, in another embodiment, first fluid stream $F_1$ is a feed solution, and second and third fluid streams $F_2$, $F_3$ are the same or different anti-solvents having the same or different concentrations.

While passing through orifice 450, the velocity of mixed first, second, and third fluid streams $F_1$, $F_2$, $F_3$ increases to a minimum velocity (i.e., velocity at which cavitation bubbles begin to appear) dictated by the physical properties of first, second, and third fluid streams $F_1$, $F_2$, $F_3$. As first, second, and third fluid streams $F_1$, $F_2$, $F_3$ continue to pass through orifice 450, hydrodynamic cavitation field 440 (which generates cavitation bubbles) is formed downstream of orifice 450. Upon reaching an elevated static pressure zone, the bubbles collapse causing high local pressures (to 5,000 kg/cm$^2$) and temperatures (to 15,000° C.) to effect nucleation and thereby directly produce tiny crystals. The remaining fluids exit flow-through channel 415 via outlet 430, while the product crystals isolated using conventional recovery techniques.

Figure 8:
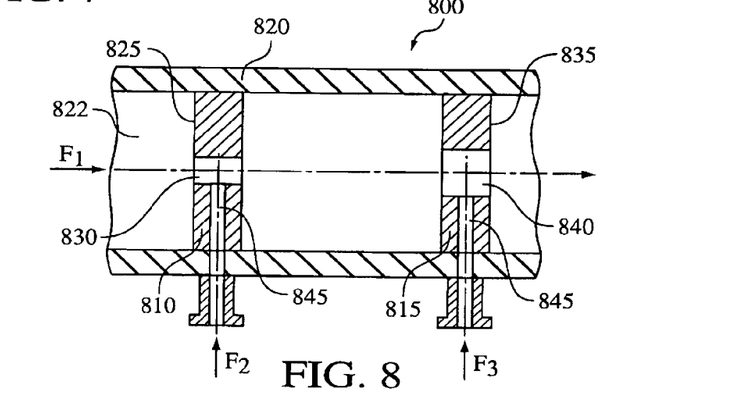
FIG. 8 is a longitudinal section of hydrodynamic cavitation crystallization device 800 according to another embodiment of the present invention.

FIG. 8 illustrates yet another embodiment of a hydrodynamic cavitation crystallization device 800 which is similar to device 500 illustrated in FIG. 5 in structure and operation, except that device 800 includes two cavitation generators 810, 815 arranged in series in flow-through channel 820 to create two stages of hydrodynamic cavitation. Flow-through channel 820 includes an inlet 822 to introduce a first fluid stream $F_1$ (in the direction of the arrows). First cavitation generator 810 is a disk 825 positioned within flow-through channel 820 and includes a first orifice 830 disposed therein having a diameter. Second cavitation generator 815 is a disk 835 positioned within flow-through channel 820 and includes a second orifice 840 having a diameter that is greater than the first diameter of first orifice 830. Obviously, in another embodiment, the diameter of first orifice 830 may be greater than the diameter of second orifice 840.

Disposed in the wall of flow-through channel 820 and in fluid communication with first orifice 830 and second orifice 840 are first port 845 and second port 850, respectively, for introducing a second fluid stream $F_2$ and a third fluid stream $F_3$. In one embodiment, first fluid stream $F_1$ is an anti-solvent and second and third fluid streams $F_2$, $F_3$ are the same or different feed solutions having the same or different concentrations. Alternatively, in another embodiment, first fluid stream $F_1$ is a feed solution, and second and third fluid streams $F_2$, $F_3$ are the same or different anti-solvents having the same or different concentrations.

Figure 9:
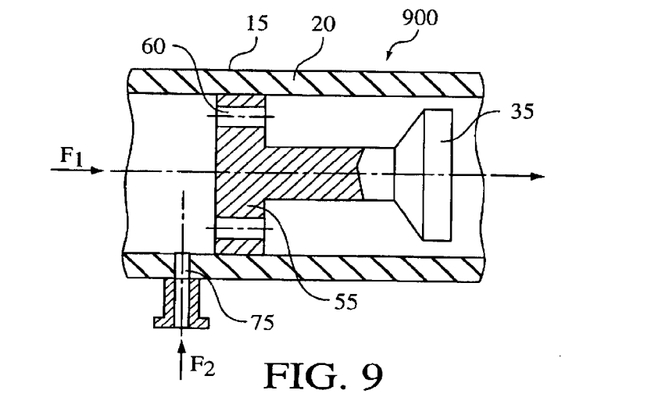
FIG. 9 is a longitudinal section of hydrodynamic cavitation crystallization device 900 according to another embodiment of the present invention.

FIG. 9 illustrates yet another embodiment of a hydrodynamic cavitation crystallization device 900 which is similar to device 100 illustrated in FIG. 1 in structure and operation, except that port 75 is disposed in cylindrical wall 20 of flow-through channel 15 and positioned in cylindrical wall 20 of flow-through channel 15 upstream from disk 55. By positioning port 75 upstream from disk 55, device 900 essentially creates two stages of hydrodynamic cavitation. In other words, disk 55 having orifices 60 is the first stage of cavitation and baffle 35 is the second stage of cavitation.

Figure 10:
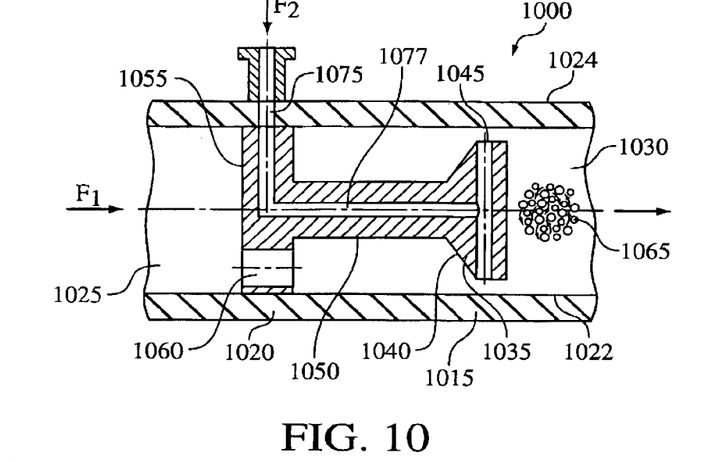
FIG. 10 is a longitudinal section of hydrodynamic cavitation crystallization device 1000 according to another embodiment of the present invention.

In yet another embodiment, FIG. 10 illustrates a hydrodynamic cavitation crystallization device 1000 comprising a flow-through channel 1015 defined by a cylindrical wall 1020 having an inner surface 1022, an outer surface 1024, an inlet 1025 for introducing a first fluid stream $F_1$ (in the direction of the arrow) into device 1000 and an outlet 1030 for exiting fluid from device 1000.

Disposed within flow-through channel 1015 along or near the centerline $C_L$ of flow-through 1015 is a cavitation generator such as a baffle 1035. As shown in FIG. 10, baffle 1035 includes a conically-shaped surface 1040 extending into a cylindrically-shaped surface 1045 wherein conically-shaped portion 1040 of baffle 1035 confronts the fluid flow. Baffle 1035 is positioned on a stem 1050 that is connected to a disk 1055 having orifice 60. Disk 1055 is mounted in inlet 25 and retains baffle 1035 inside flow-through channel 1015.

Baffle 1035 is configured to generate a hydrodynamic cavitation field 1065 downstream from baffle 1035 via a local constriction 1070 of fluid flow. In this embodiment, local constriction 1070 is an annular orifice defined between inner surface 22 of flow-through channel 15 and cylindrically-shaped surface 45 of baffle 35.

Figure 11:
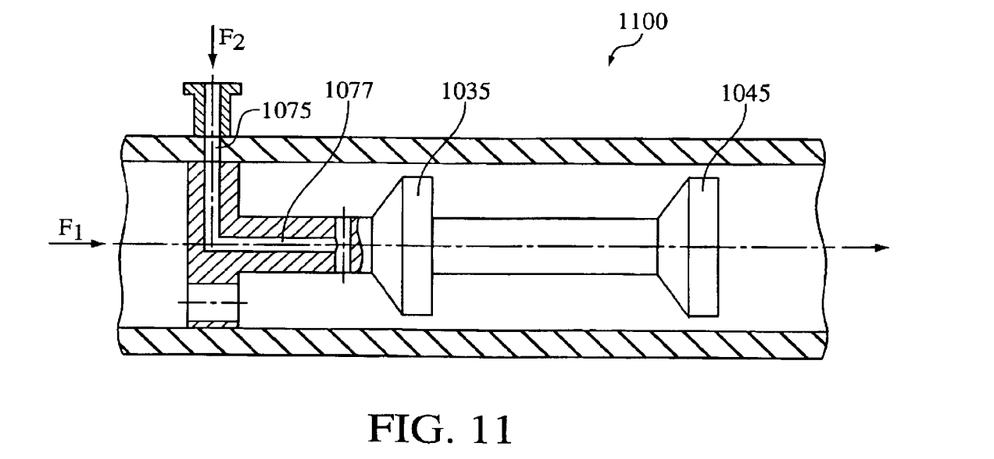
FIG. 11 is a longitudinal section of hydrodynamic cavitation crystallization device 1100 according to another embodiment of the present invention.

Disposed in cylindrical wall 1020 of flow-through channel 1015 is a port 1075 for introducing a second fluid stream $F_2$ (in the direction of the arrow) into flow-through channel 1015. Beginning at port 1075, a fluid passage 1077 is provided that extends through disk 1055, stem 1050, baffle 1035 and exits in local constriction 1070 of flow. In a slightly different embodiment as shown in FIG. 11, crystallization hydrodynamic cavitation device 1100 is provided which is similar to device 1000 illustrated in FIG. 10 in structure and operation, except that device 1100 that fluid passage 1077 exits upstream from baffle 1035 and another baffle 1135 is provided downstream from baffle 1035 thereby providing a two stage hydrodynamic cavitation process.

In operation of device 1000 illustrated in FIG. 10, first fluid stream $F_1$ enters flow-through channel 1015 via inlet 1025 and moves through orifice 1060 in the direction indicated by the arrows beneath $F_1$. Second fluid stream $F_2$ enters flow-through channel 1015 via port 1075, flows through fluid passage 1077, and mixes with first fluid stream $F_1$ while it is passing through local constriction 1070. In one embodiment, first fluid stream $F_1$ is an anti-solvent and second fluid stream $F_2$ is a feed solution. Alternatively, in another embodiment, first fluid stream $F_1$ is a feed solution and second fluid stream $F_2$ is an anti-solvent.

The mixed first and second fluid streams $F_1$, $F_2$ then pass through local constriction 1070 of flow, where the velocity of first and second fluid streams $F_1$, $F_2$ increases to a minimum velocity (i.e., velocity at which cavitation bubbles begin to appear) dictated by the physical properties of first and second fluid streams $F_1$, $F_2$. As first and second fluid streams $F_1$, $F_2$ pass through local constriction 1070 of flow, hydrodynamic cavitation field 1065 (which generates cavitation bubbles) is formed downstream of baffle 1035. Upon reaching an elevated static pressure zone, the bubbles collapse causing high local pressures (to 5,000 kg/cm$^2$) and temperatures (to 15,000° C.) to effect nucleation and thereby directly produce tiny crystals. The remaining fluids exit flow-through channel 1015 via outlet 1030, while the product crystals isolated using conventional recovery techniques.

First, second, and third fluid streams $F_1$, $F_2$, $F_3$ are fed into the devices discussed above with the aid of a pump (not shown). The type of pump selected is determined on the basis of the physiochemical properties of the pumpable medium and the hydrodynamic parameters necessary for the accomplishment of the process.

The following examples are given for the purpose of illustrating the present invention and should not be construed as limitations on the scope or spirit of the instant invention.

EXAMPLE 1

30 grams of technical grade NaCl (sodium chloride-feed solution) was dissolved 100 ml of distilled water in a beaker. 200 ml of ethanol (antisolvent) (95% ethanol+5% methanol, Aldrick™) was added to the beaker with volumetric ratio of anti-solvent/feeding solution=2:1.

The solution was mixed until NaCl (sodium chloride) crystals appeared. Upon completion, the product was filtered, washed, and then dried. The crystal particle size (d 90) was 150 microns.

EXAMPLE 2

The crystallization process was carried out in cavitation device 400 as shown in FIG. 4 and described where device 400 is capable of operating up to 8,000 psi with a nominal flow rate of 800 ml/min. The orifice used was 0.010 inches diameter at 600 psi head pressure. Ethanol (anti-solvent) was fed, via a high pressure pump, through flow-through channel 415, while NaCl (feed solution) was introduced, via a high pressure pump, into flow-through channel 415 via port 455 upstream from orifice 450 at a 2:1 anti-solvent/feed solution ratio. The combined anti-solvent and feeding solution then passed through orifice 450 causing hydrodynamic cavitation to effect nucleation. NaCl was crystallized and discharged from cavitation device 400.

The crystal particle size (d 90) of the recovered crystalline NaCl was 30 microns.

EXAMPLE 3

The crystallization process of Example 2 was repeated in cavitation device 400, but at a higher hydrodynamic pressure of 3,000 psi.

The crystal particle size (d 90) was 20 microns.

EXAMPLE 4

The crystallization process of Example 2 was repeated in cavitation device 400, but at a higher hydrodynamic pressure of 6,500 psi.

The crystal particle size (d 90) was 14 microns.

EXAMPLE 5

The crystallization process of Example 2 was repeated in cavitation device 400, but at a 6:1 ratio of anti-solvent/feeding solution and at 1,000 psi head pressure.

The crystal particle size (d 90) was 10 microns.

EXAMPLE 6

The crystallization process was carried out in cavitation device 500 as shown in FIG. 5 and described where the orifice used was 0.010 inches in diameter at 400 psi head pressure.

2000 ml of Ethanol (anti-solvent) was recirculated in cavitation device 500. A 250 ml solution of NaCl was added to cavitation device 500 directly into the local constriction in orifice 450 via entry port 455. The total time of addition was 7 minutes.

The crystal particle size (d 90) was 20 microns.

Although the invention has been described with reference to the preferred embodiments, it will be apparent to one skilled in the art that variations and modifications are contemplated within the spirit and scope of the invention. The drawings and description of the preferred embodiments are made by way of example rather than to limit the scope of the invention, and it is intended to cover within the spirit and scope of the invention all such changes and modifications.

What is claimed is:

1. A process for crystallizing a compound using hydrodynamic cavitation comprising the steps of:
    mixing at least one stream of a solution of such compound to be crystallized with at least one stream of an anti-solvent; and
    passing the mixed streams at an elevated pressure through a local constriction of flow to create hydrodynamic cavitation thereby causing nucleation and the direct production of crystals.

2. The process of claim 1, wherein the compound to be crystallized is an inorganic material.

3. The process of claim 1, wherein the compound to be crystallized is an organic material.

4. The process of claim 1, wherein the mixing step occurs prior to the local constriction of flow.

5. The process of claim 1, wherein the mixing step occurs in the local constriction of flow.

6. The process of claim 1, wherein hydrodynamic cavitation is created by a cavitation generator.

7. The process of claim 6, wherein the cavitation generator includes at least one baffle spaced-apart from a wall of a flow-through channel, thereby defining the local constriction of flow between the wall and the baffle.

8. The process of claim 1, including adding at least one surfactant to the mixed streams.

9. The process of claim 1, wherein the nucleation and the direct production of crystals occurs in a hydrodynamic cavitation field located downstream of the local constriction of flow.

10. A method to effect nucleation in a crystallization process, comprising:
    flowing a stream of at least one feed solution and a stream of at least one anti-solvent into a hydrodynamic cavitation crystallization device and mixing the feed solution and anti-solvent in the device to produce mixed streams;
    passing the mixed streams through a local constriction of flow in the device, thereby producing cavitation bubbles downstream from the local constriction of flow; and
    collapsing the cavitation bubbles in an elevated static pressure zone, thereby temperature effecting nucleation and producing crystals.

11. The method of claim 10, including adding at least one surfactant into the hydrodynamic cavitation crystallization device and mixing the surfactant with one or more of, the feed solution, the anti-solvent, and the mixed streams.

12. The method of claim 10, including isolating the crystals.

13. The method of claim 10, wherein at least one feed solution or one anti-solvent includes one or more of, ethanol, methanol, ethyl acetate, halogenated solvents, methylene chloride, acetonitrile, acetic acid, hexanes, ethers, and water.

14. The method of claim 10, wherein at least one feed solution or one anti-solvent includes one or more surfactants.

15. The method of claim 10, wherein the local constriction of flow is defined between at least one wall of a flow-through channel and a baffle spaced-apart from the at least one wall.

16. The method of claim 10, wherein passing the mixed streams through a local constriction of flow in the device includes increasing a velocity of the mixed streams to a minimum velocity which is dictated by the physical properties of the at least one feed solution and the at least one anti-solvent.

17. A process for producing crystals from a compound, comprising:
    flowing a first fluid into a local constriction of flow in a device capable of producing hydrodynamic cavitation;
    introducing a second fluid into the local constriction of flow to produce a mixture of the first fluid and the second fluid;
    producing a hydrodynamic cavitation field downstream of the local constriction of flow and cavitation bubbles in the mixture;
    collapsing the cavitation bubbles in an elevated static pressure zone, thereby effecting nucleation and producing crystals from the compound; and
    isolating the crystals.

18. The process of claim 17, wherein the first fluid includes at least one feed solution and the second fluid includes at least one anti-solvent.

19. The process of claim 17, wherein the first fluid includes at least one anti solvent and the second fluid includes at least one feed solution.

20. The process of claim 17, wherein the local constriction of flow is defined between at least one wall of a flow-through channel and a baffle spaced-apart from the at least one wall.

* * * * *